(12) United States Patent
Tagami et al.

(10) Patent No.: US 6,717,182 B1
(45) Date of Patent: Apr. 6, 2004

(54) EDGE-EMITTING LIGHT-EMITTING DEVICE HAVING IMPROVED EXTERNAL LUMINOUS EFFICIENCY AND SELF-SCANNING LIGHT-EMITTING DEVICE ARRAY COMPRISING THE SAME

(75) Inventors: Takashi Tagami, Osaka (JP); Yukihisa Kusuda, Osaka (JP); Seiji Ohno, Osaka (JP); Nobuyuki Komaba, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/762,520

(22) PCT Filed: Jun. 6, 2000

(86) PCT No.: PCT/JP00/03662

§ 371 (c)(1),
(2), (4) Date: Feb. 8, 2001

(87) PCT Pub. No.: WO00/76003

PCT Pub. Date: Dec. 14, 2000

Related U.S. Application Data

(63) Continuation-in-part of application No. 09/043,106, filed on Sep. 24, 1996, now Pat. No. 6,180,960.

(30) Foreign Application Priority Data

Jun. 8, 1999 (JP) .......................... 11-160458
Aug. 11, 1999 (JP) .......................... 11-227134

(51) Int. Cl.$^7$ .................. H01L 27/15; H01L 33/00; H01L 29/40
(52) U.S. Cl. .................. 257/83; 257/84; 257/115; 257/118; 257/119; 257/107; 257/91; 257/99; 257/745
(58) Field of Search .................. 257/83, 84, 115, 257/118, 119, 107, 91, 99, 745

(56) References Cited

U.S. PATENT DOCUMENTS 5,361,273 A * 11/1994 Kosaka .................. 257/85
6,180,960 B1 * 1/2001 Kusuda et al. .................. 257/91

FOREIGN PATENT DOCUMENTS

| DE | 000070234 A2 * | 1/1983 |
| JP | 63-110677 | 5/1988 |
| JP | 5-299693 | 11/1993 |
| JP | 406188404 A * | 7/1994 |
| JP | 9-85985 | 3/1997 |
| JP | 9-92885 | 4/1997 |
| JP | 9-283792 | 10/1997 |

OTHER PUBLICATIONS

PCT International Search Report, Aug. 25, 2000.

* cited by examiner

*Primary Examiner*—George Eckert
*Assistant Examiner*—Joseph Nguyen
(74) *Attorney, Agent, or Firm*—RatnerPrestia

(57) ABSTRACT

A self-scanning light-emitting element array using an end face light-emitting thyristor having improved external emission efficiency is provided. To improve the external emission efficiency of the end face light-emitting thyristor, the present invention adopts such structure that the current injected from an anode is concentrated to near the end face of the light-emitting thyristor. A self-scanning light-emitting element array is implemented by using such end face light-emitting thyristor.

4 Claims, 8 Drawing Sheets

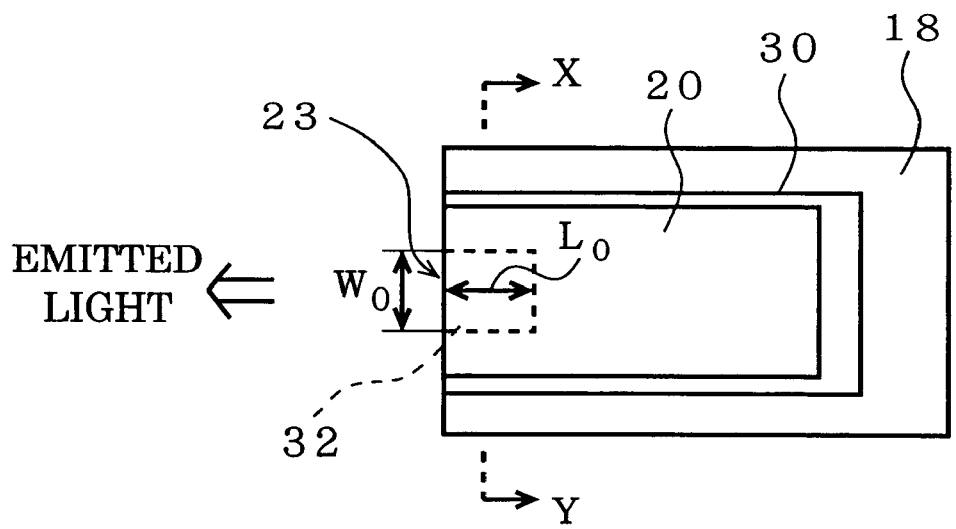
F I G. 3 A
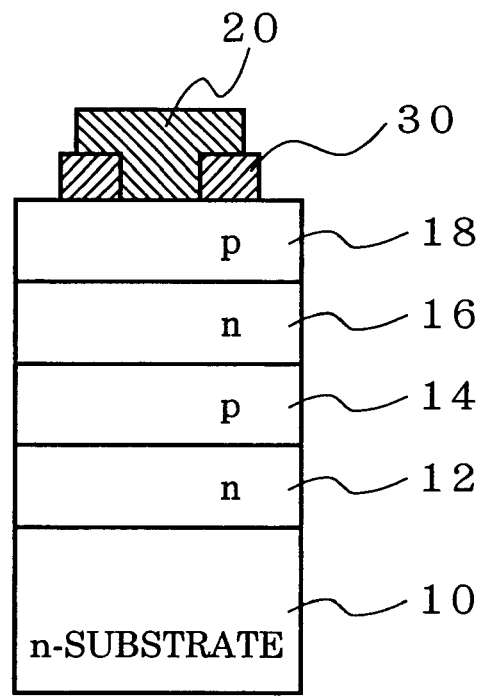
F I G. 3 B

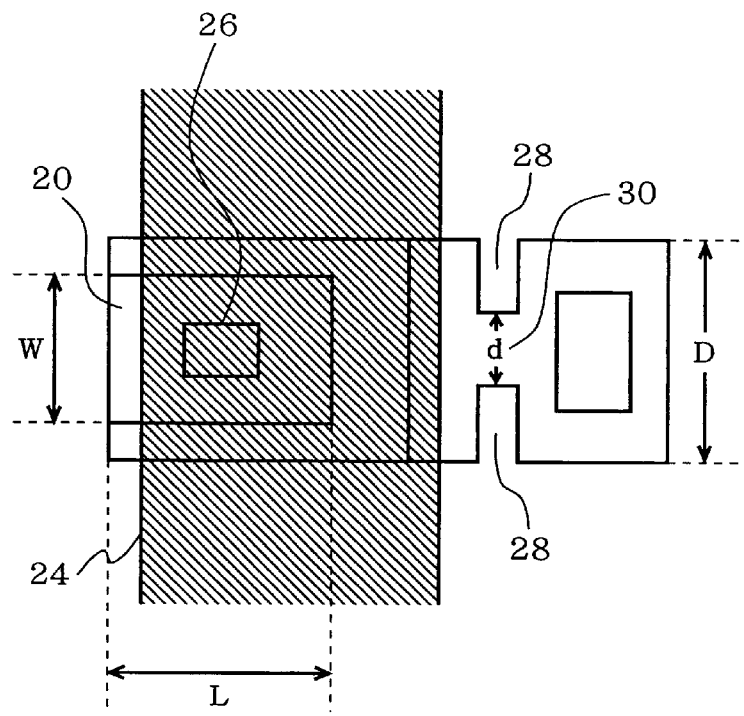
F I G. 4 A
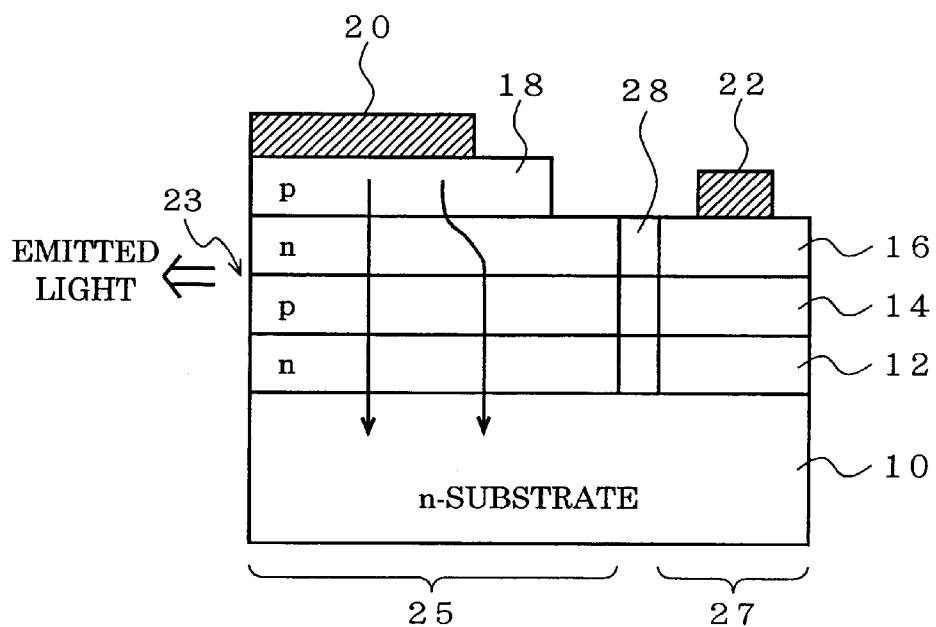
F I G. 4 B

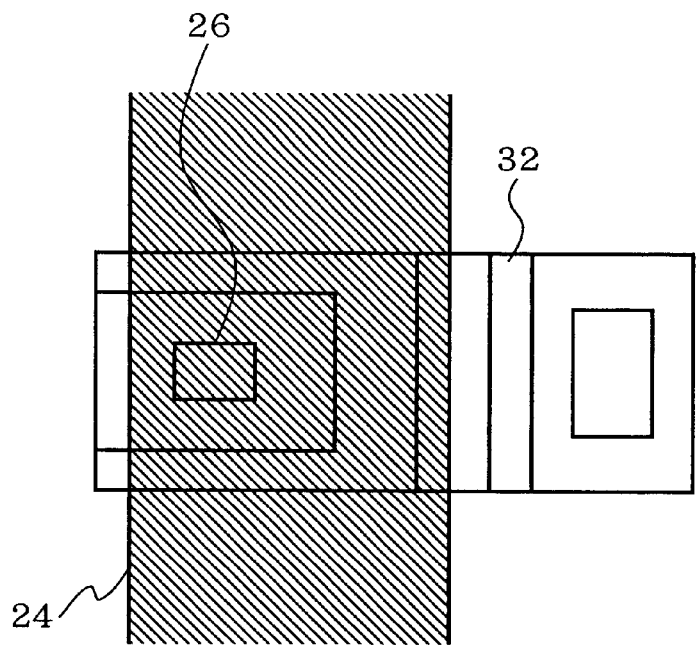
F I G. 5 A
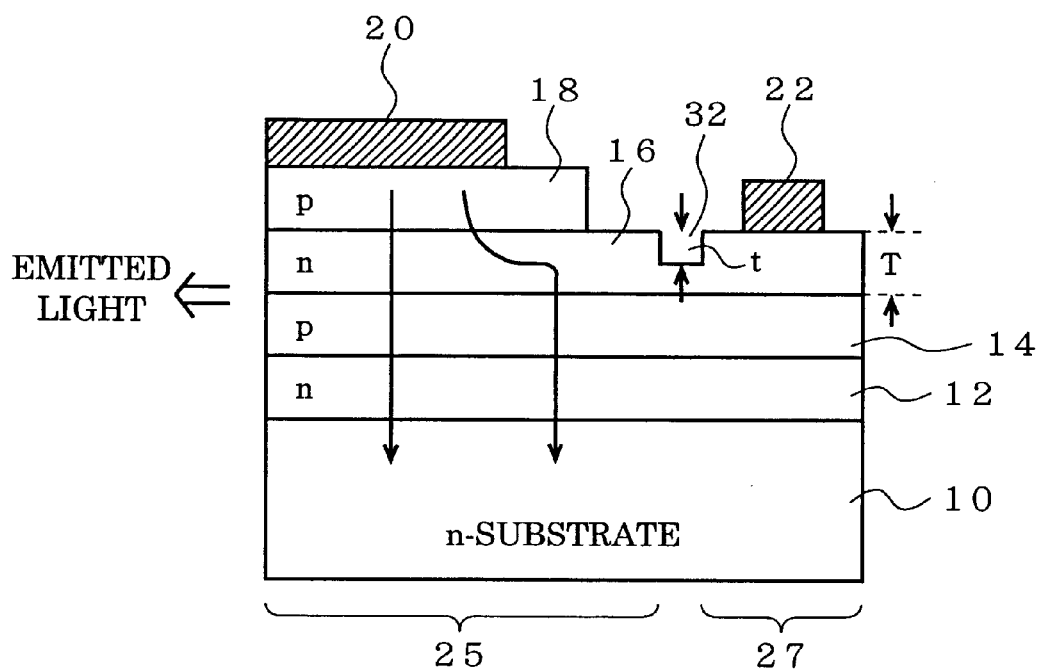
F I G. 5 B

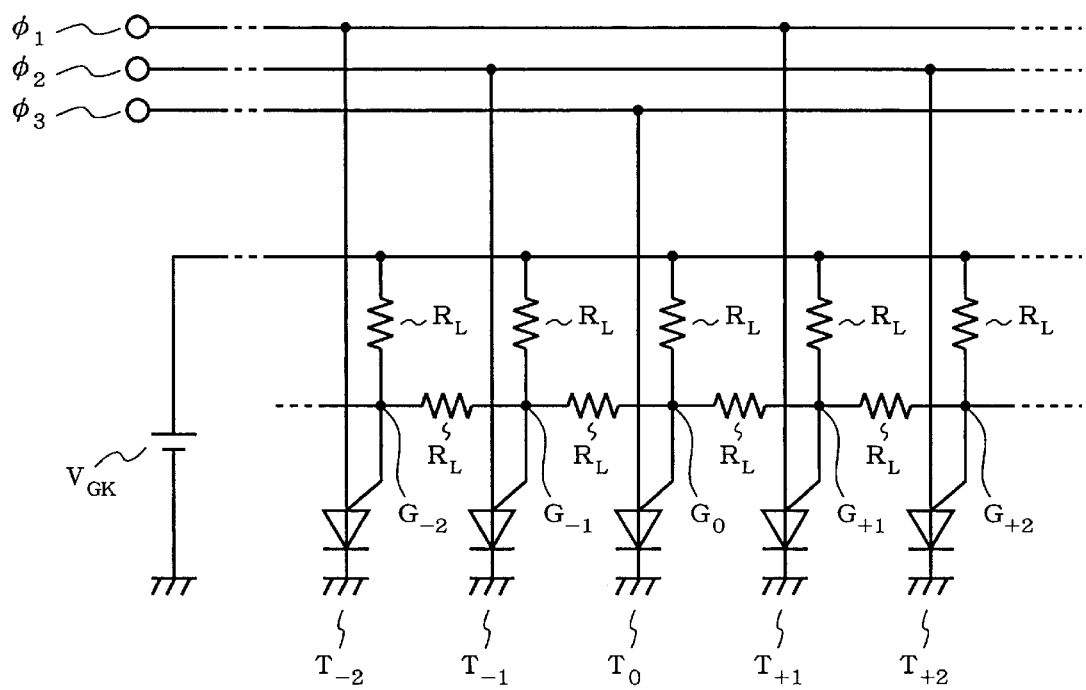
F I G . 6

EDGE-EMITTING LIGHT-EMITTING DEVICE HAVING IMPROVED EXTERNAL LUMINOUS EFFICIENCY AND SELF-SCANNING LIGHT-EMITTING DEVICE ARRAY COMPRISING THE SAME

This application is a continuation-in-part of U.S. patent application Ser. No. 09/043,106, filed Sep. 24, 1996, now U.S. Pat. No. 6,180,960, issued Jan. 30, 2001.

TECHNICAL FIELD

The present invention generally relates to an end face light-emitting element having an increased light emission efficiency and a self-scanning light-emitting element array using such end face light-emitting elements, particularly to a three-terminal end face light-emitting thyristor and a self-scanning light-emitting element array using such three-terminal end face light-emitting thyristors.

BACKGROUND ART

An end face light-emitting diode array has heretofore been known as a high-density light-emitting element array which may increase a coupling efficiency to lenses. The basic structure of such end face light-emitting diode arrays is described in "IEEE Trans. Electron Devices, ED-26, 1230 (1979)", for example. Conventional end face light-emitting diode arrays, however, have problems such that there are difficulties in fabricating them high-density, compact and low-cost, because each of diodes is to be connected to a driving circuit in order to drive the end face light-emitting diode array.

To resolve these problems, the present applicant has already disclosed a self-scanning end face light-emitting element array having a pnpn structure in which a driving circuit and a light-emitting element array are integrated in one chip (see Japanese Patent Publication No. 9-85985). A three-terminal end face light-emitting thyristor which is used as the end face light-emitting element disclosed in this publication is shown in FIGS. 1A and 1B. FIG. 1A shows plan view and FIG. 1B cross-sectional view taken along the X-Y line in FIG. 1A.

The end face light-emitting thyristor comprises an n-type semiconductor layer 12, a p-type semiconductor layer 14, an n-type semiconductor layer 16, and a p-type semiconductor layer 18 formed on an n-type semiconductor substrate 10; an anode electrode 20 formed on the p-type semiconductor 18 so as to make ohmic contact therewith; and a gate electrode 22 formed on the n-type semiconductor layer 16 so as to make ohmic contact therewith. On the entire structure provided is an insulting film (not shown) made of a light-transmitting, insulating material, on which an Al wiring 24 is further provided (see FIG. 1A). The Al wiring 24 is not shown in FIG. 1B for simplifying the figure. In the insulating film opened is a contact hole 26 for electrically connecting the anode electrode 20 to the Al wiring 26. While not shown in FIG. 1B, a cathode electrode is provided on the bottom surface of the substrate 10.

In this conventional end face light-emitting thyristor, light is emitted from an end face 23 of the semiconductor layers 14, 16 both thereof constitute gate layers. As shown by arrows in FIG. 1B, the most of current fed from the anode electrode 20 flows directly downward (this injected current is indicated by I1), and a part of the current flows going round to the gate electrode 22 (this injected current is indicated by I2). Although both of these injected current I1 and I2 contribute to light generation in the semiconductor layers, the light generated by the current I2 cannot contribute to external light emission from the end face 23 since the current I2 generates light in the area apart from the end face 23. As a result, the amount of light emitted from the end face is reduced only by the amount of light not contributed, thus external light emission efficiency is decreased.

DISCLOSURE OF THE INVENTION

An object of the present invention is to provide an end face light-emitting thyristor having improved external light emission efficiency.

Another object of the present invention is to provide a self-scanning light-emitting element array using such end face light-emitting thyristor.

According to a first aspect of the present invention, an end face light-emitting thyristor for emitting light from an end face thereof comprises a first semiconductor layer of a first conductivity type, a second semiconductor layer of a second conductivity type, a third semiconductor layer of the first conductivity type, and a fourth semiconductor layer of the second conductivity type stacked in that order on a substrate of the first conductivity type; an electrode provided in such a manner that a part thereof makes ohmic contact with the fourth semiconductor layer in the vicinity of the end face for injecting current into the semiconductor layers; and an insulating layer provided between the fourth semiconductor layer and the part of the electrode that is not made ohmic contact with the fourth semiconductor layer.

It is also possible that an opening is formed in the part of the insulating layer faced to the end face, making the electrode ohmic contact with the fourth semiconductor layer via the opening.

In this way, the flow of the current injected from the electrode is concentrated to near the end face of the light-emitting thyristor.

According to a second aspect of the present invention, an end face light-emitting thyristor for emitting light from an end face thereof comprises a first semiconductor layer of a first conductivity type, a second semiconductor layer of a second conductivity type, a third semiconductor layer of the first conductivity type, and a fourth semiconductor layer of the second conductivity type stacked in that order on a substrate of the first conductivity type; a first electrode provided on the fourth semiconductor layer; and a second electrode provided on the third semiconductor layer. The first, second and third semiconductor layers have a necked portion or a groove between a region including the first electrode and a region including the second electrode.

By providing such necked portion or groove, the resistance value between the region including the first electrode and the region including the second electrode becomes larger. As a result, the external emission efficiency is increased because the current component which flows toward the region including the second electrode is decreased, thus the most of the injected current flows in the region including the first electrode.

Using end face light-emitting thyristor described above, a self-scanning light-emitting element array of the following structure may be implemented.

A first structure of the self-scanning light-emitting element array comprises a plurality of light-emitting elements each having a control electrode for controlling threshold voltage or current for light-emitting operation. The control electrodes of the light-emitting elements are connected to the control electrode of at least one light-emitting element located in the vicinity thereof via an interactive resistor or an electrically unidirectional element, and a plurality of wiring to which voltage or current is applied are connected to electrodes for controlling the light emission of light-emitting elements.

A second structure of the self-scanning light-emitting element array comprises a self-scanning transfer element array having such a structure that a plurality of transfer elements each having a control electrode for controlling threshold voltage or current for transfer operation are arranged, the control electrodes of the transfer elements are connected to the control electrode of at least one transfer element located in the vicinity thereof via an interactive resistor or an electrically unidirectional element, power-supply lines are connected to the transfer elements by electrical means, and clock lines are connected to the transfer elements; and a light-emitting element array having such a structure that a plurality of light-emitting elements each having a control electrode for controlling threshold voltage or current are arranged, the control electrodes of the light-emitting element array are connected to the control electrodes of said transfer elements by electrical means, and lines for applying current for light emission of the light-emitting element are provided.

According to the structures described above, increased external emission efficiency, high-densitiy, compact and low-cost self-scanning light-emitting element arrays may be implemented.

BRIEF DESCRIPTION OF THE DRAWINGS

FIGS. 3A and 3B are diagrams illustrating the structure of an end face light-emitting thyristor in a second embodiment of the present invention.

FIGS. 4A and 4B are diagrams illustrating the structure of an end face light-emitting thyristor in a third embodiment of the present invention.

FIGS. 5A and 5B are diagrams illustrating the structure of an end face light-emitting thyristor in a fourth embodiment of the present invention.

FIG. 6 is an equivalent circuit diagram of a first structure of a self-scanning light-emitting element array.

BEST MODE FOR CARRYING OUT THE INVENTION

Figure 2A:
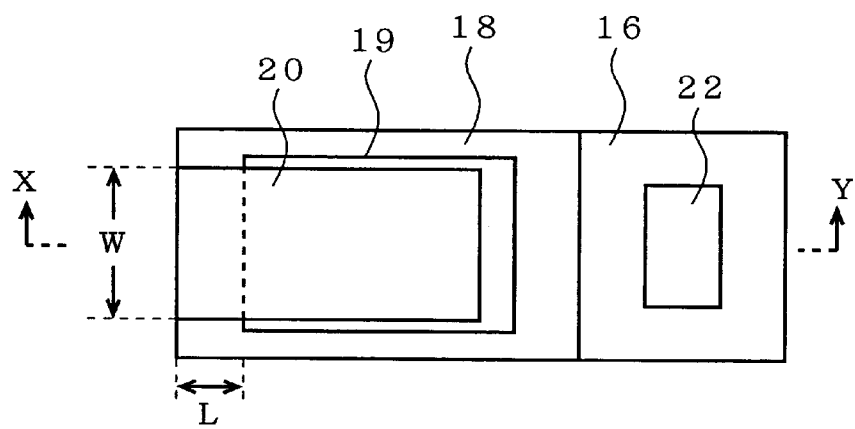
FIGS. 2A and 2B are diagrams illustrating the structure of an end face light-emitting thyristor in a first embodiment of the present invention.
Figure 2B:
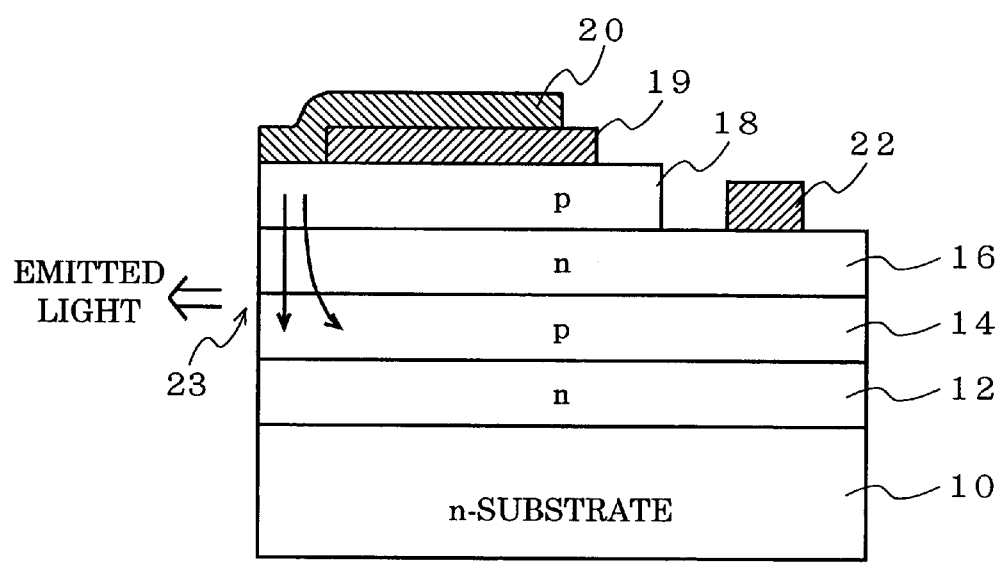

A first embodiment of an end face light-emitting thyristor according to the present invention will now be described. FIG. 2A is a plan view of an end face light-emitting thyristor of the first embodiment, and FIG. 2B is a cross-sectional view taken along the X-Y line in FIG. 2A. In this end face light-emitting thyristor, an n-type semiconductor layer (a cathode layer) 12, a p-type semiconductor (a base layer) 14, an n-type semiconductor layer (a base layer) 16, and a p-type semiconductor layer (an anode layer) 18 are stacked on an n-type semiconductor substrate 10. On the anode layer 18 provided is an insulting film 19 apart from the end face 23. On the insulating film 19 and the part of the anode layer 18 not covered by the insulating film 19 provided is an anode electrode 20. On the gate layer 16 provided is a gate electrode 22.

Figure 1A:
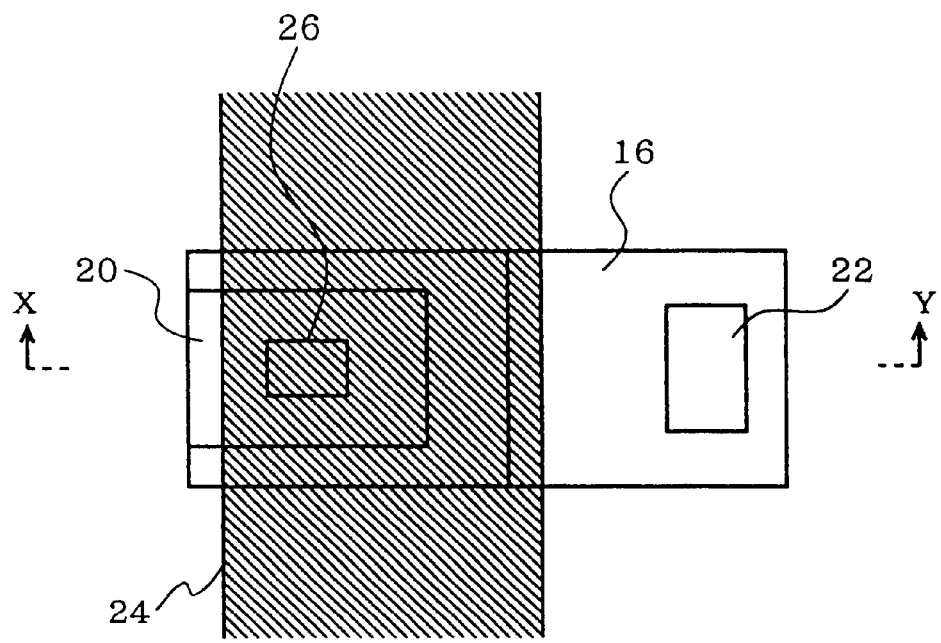
FIGS. 1A and 1B are diagrams illustrating the structure of a conventional end face light-emitting thyristor.
Figure 1B:
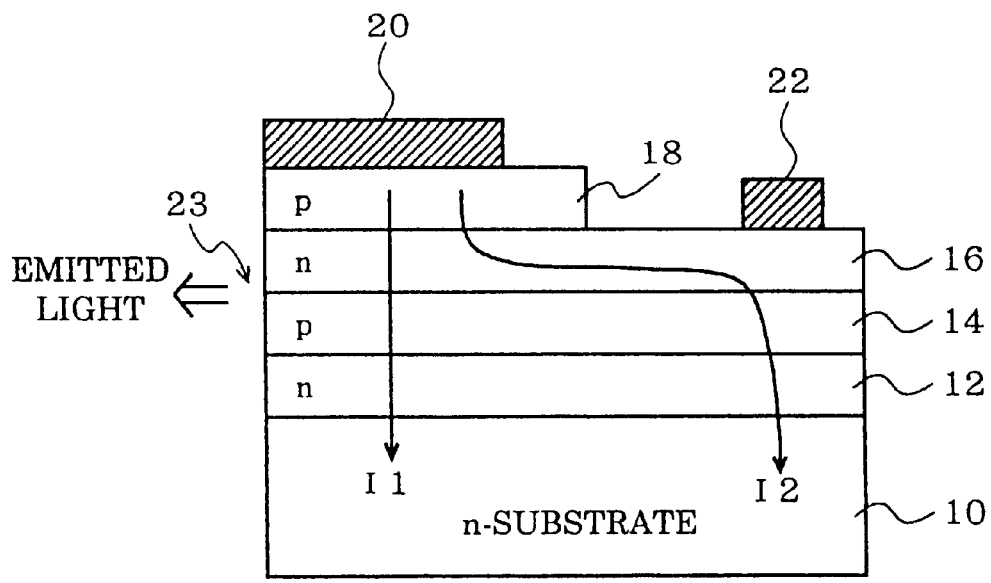

The end face light-emitting thyristor of this embodiment is different from the conventional thyristor shown in FIGS. 1A and 1B only in that the insulating film 19 is further provided on the anode layer 18. The reason why the insulating film 19 is provided will be explained in the following. In order to increase the external emission efficiency of an end face light-emitting thyristor, it is required that the anode electrode 20 is to be ohmic contacted with the anode layer 18 in the vicinity of the end face 23 so that the flow of the current injected from the anode electrode 20 is concentrated to near the end face 23. The size of the anode electrode 20 itself cannot be made small to concentrate the current to near the end face 23, since the anode electrode is required to make contact with the Al wiring as shown in FIG. 1A. In this embodiment, consequently, between the anode 20 and the anode layer 18 provided is the insulating film 19 apart from the end face 23 so as to remain the region where the anode electrode 20 is ohmic contacted to the anode layer 18 only in the vicinity of the end face 23. In this case, if the contact area between the anode electrode 20 and the anode layer 18 becomes smaller, then the flow distribution of the current injected from the anode electrode 20 is narrowed so that the external emission efficiency is increased. Assuming that the length and width of the contact area between the anode electrode 20 and the anode layer 18 are L and W, respectively, as shown in FIG. 2A, when the case 1 in which L=5 $\mu$m and W=10 $\mu$m and the case 2 in which L=10 $\mu$m and W=10 $\mu$m are compared with each other, it is appreciated that the case 1 having smaller L realizes about 50% larger amount of light emission than that of the case 2.

A second embodiment of an end face light-emitting thyristor according to the present invention will now be described. FIG. 3A is a plan view of an end face light-emitting thyristor of the second embodiment, and FIG. 3B is a cross-sectional view taken along the X-Y line in FIG. 3A. It is noted that elements similar to those in FIGS. 2A and 2B are designated by the same reference numeral as in FIGS. 2A and 2B.

The second embodiment intends to narrow the current flow distribution in a width direction of the anode electrode in the first embodiment. For that purpose, an insulating film 30 is provided on the anode layer 18 starting from the end face 23, and an opening (the width $W_0$, and the length $L_0$) 32 is formed in the insulating film at the end face 23. Through the opening 32, made is a part of the anode electrode 20 ohmic contact with the anode layer 18. It is possible, therefore, to select the contact area ($W_0 \times L_0$) of the anode electrode 20 to the anode layer 18. According to this structure, the width $W_0$ of the opening 32 may be smaller than the width W of the electrode 20, resulting in the substantial decrease of the contact area of the anode electrode 20 to the anode layer 18. Therefore, the density of the current through the semiconductor layers is increased so that the external emission efficiency may be elevated.

A third embodiment of an end face light-emitting thyristor according to the present invention will now be described. FIGS. 4A and 4B are plan and side views of an end face light-emitting thyristor according to the third embodiment. The structure of this embodiment is essentially the same as that of the thyristor shown in FIGS. 1A and 1B. In FIGS. 4A and 4B, therefore, elements similar to those in FIGS. 1A and 1B are designated by the same reference numeral as in FIGS. 1A and 1B.

In the end face light-emitting thyristor of this embodiment, notches 28 are provided on both sides of the semiconductor layers 12, 14 and 16 between the region 25 including the anode electrode 20 and the region 27 including the gate electrode 22 to form a necked portion 30 on the semiconductor layer 12, 14 and 16. The notches 28 can be easily formed by etching.

Since the width d of the necked portion 30 is smaller than the width D of the semiconductor layer 12, 14 and 16, the resistance value of the necked portion 30 becomes larger. As a result, the current injected from the anode electrode 20 does not flow toward the gate electrode as shown by an arrow in FIG. 4B, thus contributing more to light generation under the anode electrode. When D=13 μm, and d=5 μm, the external emission efficiency is increased by about 10%.

In order to increase further the external emission efficiency of the end face light-emitting thyristor, the contact area between the anode electrode 20 and the anode layer 18 is to be decreased as shown in the first and second embodiments.

A fourth embodiment of an end face light-emitting thyristor according to the present invention will now be described. FIGS. 5A and 5B are plan and side views of an end face light-emitting thyristor according to the fourth embodiment. The structure of this embodiment is essentially the same as that of the thyristor shown in FIGS. 1A and 1B. In FIGS. 5A and 5B, therefore, elements similar to those in FIGS. 1A and 1B are designated by the same reference numeral as in FIGS. 1A and 1B.

According to the end face light-emitting thyristor of this embodiment, a groove 32 is provided on the n-type semiconductor (n-type gate layer) between the region 25 including the anode electrode 20 and the region 27 including the gate electrode 22. The depth t of the groove 32 is such that the groove is kept a certain distance away from a depletion layer formed between the n-type semiconductor layer 16 and the p-type semiconductor layer 14. This is because if the groove 32 reaches the depletion layer, the resistance value of the n-type semiconductor layer 16 between the anode electrode 20 and the gate electrode 22 becomes large, remarkably aggravating the electrical property of the thyristor.

By providing the groove 32, the resistance value between the anode electrode region and the gate electrode becomes large. As a result, the current injected from the anode electrode 20 does not flow toward the gate electrode as shown by an arrow in FIG. 5B, thus contributing to light generation under the anode electrode. When the thickness T of the n-type semiconductor layer 16 is 1 μm and the depth t of the groove is 0.5 μm, the external emission efficiency is increased by about 10%.

In order to increase further the external emission efficiency of the end face light-emitting thyristor, the contact area between the anode electrode 20 and the anode layer 18 is to be decreased as shown in the first and second embodiments.

In embodiments 1, 2, 3 and 4 described above, semiconductor layers are stacked in the order of npnp on an n-type semiconductor substrate. Needless to say, this invention can be applied to a structure where semiconductor layers are stacked in the order of pnpn on a p-type semiconductor substrate. In this case, the type of electrode provided on the uppermost n-type semiconductor layer is a cathode electrode, while that provided on the rear surface of the p-type semiconductor substrate is an anode electrode.

The reason why a semiconductor layer of the same conductivity type as the semiconductor substrate is stacked immediately above the semiconductor substrate in the above embodiments is in the following. In general, when a pn (or np) junction is formed directly on the surface of a semiconductor substrate, the poor crystallinity of the formed semiconductor layer tends to degrade the properties of a device. This is because when a crystal layer is epitaxially grown on a substrate surface, the crystallinity near the substrate is degraded compared with the crystallinity after the crystal layer has been grown above a certain level. The above problem can be solved by first forming the same semiconductor layer as the semiconductor substrate, and then forming the pn (or np) junction. It is therefore desirable to interpose the semiconductor layer therebetween.

Three fundamental structures of self-scanning light-emitting element arrays to which the end face light-emitting thyristor of the present invention can be applied will now be described.

FIG. 6 shows an equivalent circuit diagram of a first fundamental structure of the self-scanning light-emitting element array. According to the structure, end face light-emitting thyristors . . . $T_{-2}$, $T_{-1}$, $T_0$, $T_{+1}$, $T_{+2}$, . . . are used as light-emitting elements, each of thyristors comprising gate electrodes . . . $G_{-2}$, $G_{-1}$, $G_0$, $G_{+1}$, $G_{+2}$ . . . , respectively. Supply voltage $V_{GK}$ is applied to all of the gate electrodes via a load resistor $R_L$, respectively. The neighboring gate electrodes are electrically connected to each other via a resistor $R_I$ to obtain interaction. Each of three transfer clock ($\phi_1$, $\phi_2$, $\phi_3$) lines is connected to the anode electrode of each light-emitting element at intervals of three elements (in a repeated manner).

The operation of this self-scanning light-emitting element array will now be described. Assume that the transfer clock $\phi_3$ is at a high level, and the light-emitting thyristor $T_0$ is turned on. At this time, the voltage of the gate electrode $G_0$ is lowered to a level near zero volts due to the characteristic of the light-emitting thyristor. Assuming that the supply voltage $V_{GK}$ is 5 volts, the gate voltage of each light-emitting thyristor is determined by the resistor network consisting of the load resistors $R_L$ and the interactive resistors $R_I$. The gate voltage of a thyristor near the light-emitting thyristor $T_0$ is lowered most, and the gate voltage V(G) of each subsequent thyristor rises as it is remote from the thyristor $T_0$. This can be expressed as follows:

$$V(G_0)<V(G_{+1})=V(G_{-1})<V(G_{+2})=V(G_{-2}) \quad (1)$$

The difference among these voltages can be set by properly selecting the values of the load resistor $R_L$ and the interactive resistor $R_I$.

It is known that the turn-on voltage $V_{ON}$ of the light-emitting thyristor is a voltage that is higher than the gate voltage V(G) by the diffusion potential $V_{dif}$ of pn junction as shown in the following formula.

$$V_{ON} \approx V(G)+V_{dif} \quad (2)$$

Consequently, by setting the voltage applied to the anode to a level higher than this turn-on voltage $V_{ON}$, the light-emitting thyristor may be turned on.

In the state where the light-emitting thyristor $T_0$ is turned on, the next transfer clock $\phi_1$ is raised to a high level. Although this transfer clock $\phi_1$ is applied to the light-emitting thyristors $T_{+1}$ and $T_{-2}$ simultaneously, only the light-emitting thyristor $T_{+1}$ can be turned on by setting the high-level voltage $V_H$ of the transfer clock $\phi_1$ to the following range.

$$V(G_{-2})+V_{dif}>V_H>V(G_{+1})+V_{dif} \quad (3)$$

By doing this, the light-emitting thyristors $T_0$ and $T_{+1}$ are turned on simultaneously. When the transfer clock $\phi_3$ is lowered to a low level, the light-emitting thyristors $T_0$ is turned off, and this completes transferring ON state from the thyristor $T_0$ to the thyristor $T_{+1}$.

Based on the principle described above, the ON state of the light-emitting thyristor is sequentially transferred by setting the high-level voltage of the transfer clocks $\phi_1$, $\phi_2$ and $\phi_3$ in such a manner as to overlap sequentially and slightly with each other. In this way, the self-scanning light-emitting array according to the present invention is accomplished.

Figure 7:
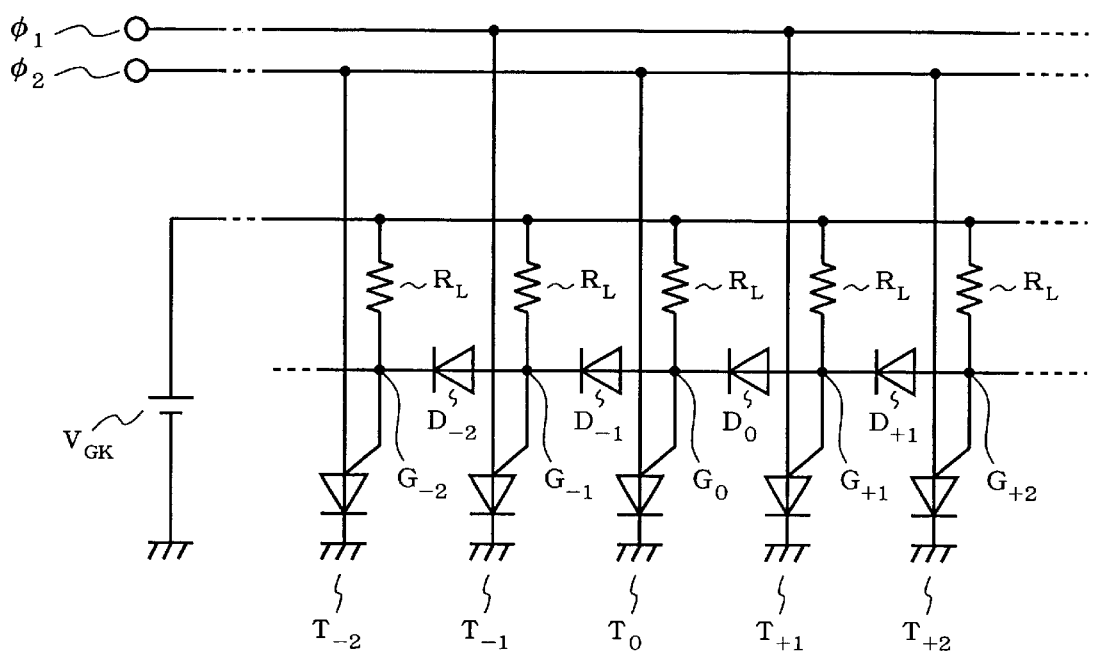
FIG. 7 is an equivalent circuit diagram of a second structure of a self-scanning light-emitting element array.

FIG. 7 shows an equivalent circuit diagram of a second fundamental structure of the self-scanning light-emitting element array. This self-scanning light-emitting element array uses a diode as means for electrically connecting the gate electrodes of light-emitting thyristors to each other. That is, the diodes . . . $D_{-2}$, $D_{-1}$, $D_0$, $D_{+1}$ . . . are used in replace of the interactive resistors $R_I$ in FIG. 6. The number of transfer clock lines may be only two due to the unidirectional of diode characteristics, then each of two clock ($\phi_1$, $\phi_2$) lines is connected to the anode electrode of each light-emitting element at intervals of two elements.

The operation of this self-scanning light-emitting element array will now be described. Assume that as the transfer clock $\phi_2$ is raised to a high level, the light-emitting thyristor $T_0$ is turned on. At this time, the voltage of the gate electrode $G_0$ is reduced to a level near zero volts due to the characteristic of the thyristor. Assuming that the supply voltage $V_{GK}$ is 5 volts, the gate voltage of each light-emitting thyristor is determined by the network consisting of the load resistors $R_L$ and the diodes D. The gate voltage of an thyristor nearest to the light-emitting thyristor $T_0$ drops most, and the gate voltages of those thyristors rise as they are further away from the light-emitting thyristor $T_0$.

The voltage reducing effect works only in the rightward direction from the light-emitting thyristor $T_0$ due to the unidirectionality and asymmetry of diode characteristics. That is, the gate electrode $G_{+1}$ is set at a higher voltage with respect to the gate electrode $G_0$ by a forward rise voltage $V_{dif}$ of the diode, while the gate electrode $G_{+2}$ is set at a higher voltage with respect to the gate electrode $G_{+1}$ by a forward rise voltage $V_{dif}$ of the diode. On the other hand, current does not flow in the diode $D_{-1}$ on the left side of the light-emitting thyristor $T_0$ because the diode $D_{-1}$ is reverse-viased. As a result, the gate electrode $G_{-1}$ is at the same potential as the supply voltage $V_{GK}$.

Although the next transfer clock $\phi_1$ is applied to the nearest light-emitting thyristor $T_{+1}$, $T_{-1}$; $T_{+3}$, $T_{-3}$; and so on, the thyristor having the lowest turn-on voltage among them is $T_{+1}$, whose turn-on voltage is approximately the gate voltage of $G_{+1}+V_{dif}$, about twice as high as $V_{dif}$. The thyristor having the second lowest turn-on voltage is $T_{+3}$, about four times as high as $V_{dif}$. The turn-on voltage of the thyristors $T_{-1}$ and $T_{-3}$ is about $V_{GK}+V_{dif}$.

It follows from the above discussion that by setting the high-level voltage of the transfer clock $\phi_1$ to a level about twice to four times as high as $V_{dif}$, only the light-emitting thyristor $T_{+1}$ can be turned-on to perform a transfer operation.

Figure 8:
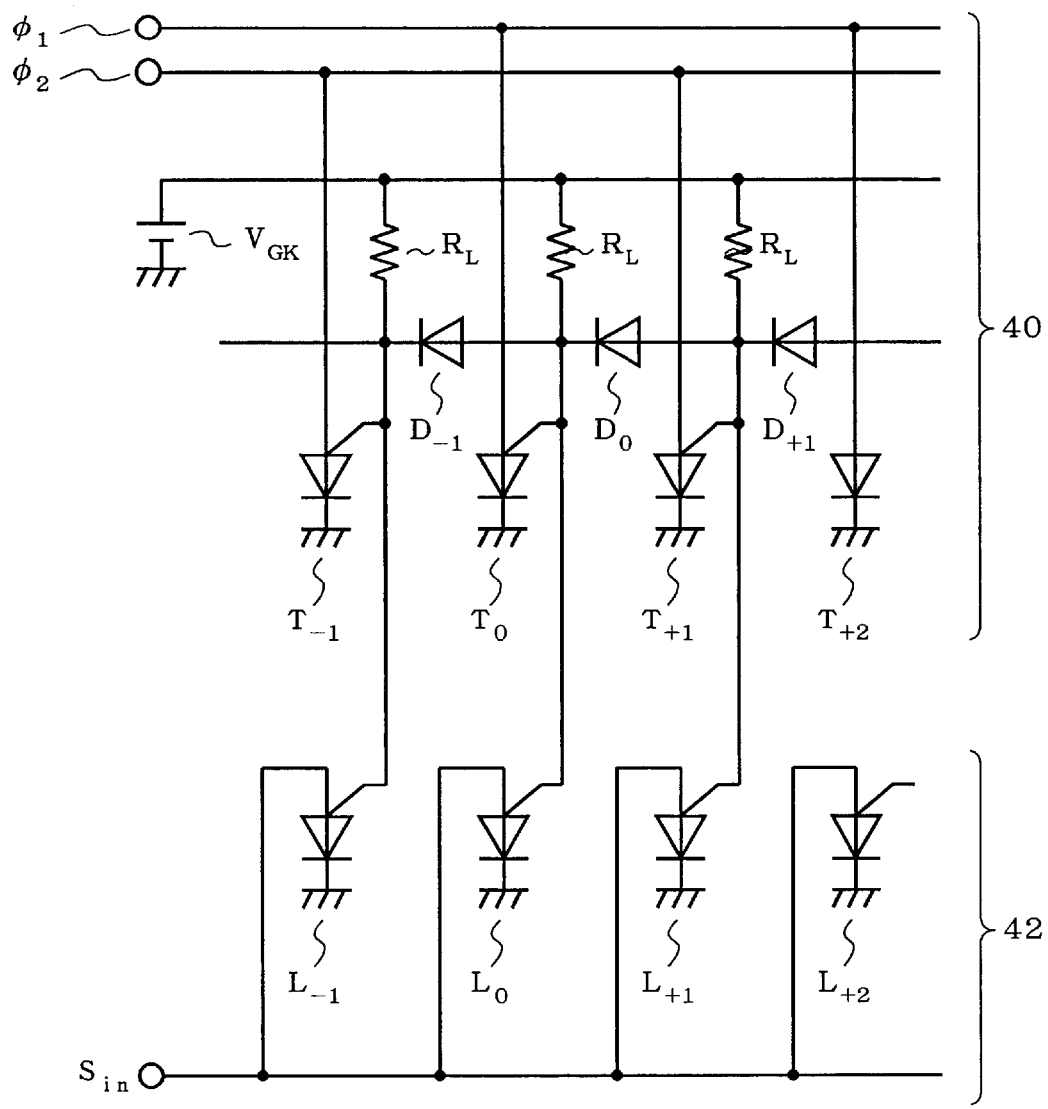
FIG. 8 is an equivalent circuit diagram of a third structure of a self-scanning light-emitting element array.

FIG. 8 shows an equivalent circuit diagram of a third fundamental structure of the self-scanning light-emitting element array. According to the structure, a transfer portion 40 and a light-emitting portion 42 are separated. The circuit structure of the transfer portion 40 is the same as that shown in FIG. 7, and the light-emitting thyristors . . . $T_{-1}$, $T_0$, $T_{+1}$, $T_{+2}$ . . . are used as transfer elements in this embodiment.

The light-emitting portion 42 comprises writable light-emitting elements $L_{-1}$, $L_0$, $L_{+1}$, $L_{+2}$ . . . , each gate thereof is connected to the gate . . . $G_{-1}$, $G_0$, $G_{+1}$ . . . of the transfer elements . . . $T_{-1}$, $T_0$, $T_{+1}$, $T_{+2}$, respectively. A write signal $S_{in}$ is applied to all of the anode of the writable light-emitting elements.

In the following, the operation of this self-scanning light-emitting array will be described. Assuming that the transfer element $T_0$ is in the ON state, the voltage of the gate electrode $G_0$ lowers below the supply voltage $V_{GK}$ and to almost zero volts. Consequently, if the voltage of the write signal $S_{in}$ is higher than the diffusion potential (about 1 volt) of the pn junction, the light-emitting element $L_0$ can be turned into a light-emission state.

On the other hand, the voltage of the gate electrode $G_{-1}$ is about 5 volts, and the voltage of the gate electrode $G_{+1}$ is about 1 volt. Consequently, the write voltage of the light-emitting element $L_{-1}$ is about 6 volts, and the write voltage of the light-emitting element $L_{+1}$ is about 2 volts. It follows from this that the voltage of the write signal which can write only in the light-emitting element $L_0$ is a range of about 1–2 volts. When the light-emitting element $L_0$ is turned on, that is, in the light-emitting state, the voltage of the write signal $S_{in}$ is fixed to about 1 volt. Thus, an error of selecting other light-elements can be prevented.

Light emission intensity is determined by the amount of current fed to the write signal $S_{in}$, an image can be written at any desired intensity. In order to transfer the light-emitting state to the next element, it is necessary to first turn off the element that is emitting light by temporarily reducing the voltage of the write signal $S_{in}$ down to zero volts.

Industrial Applicability

This invention makes it possible to provide an end face light-emitting thyristor having good external light emission efficiency. A self-scanning light-emitting element array using this end face light-emitting thyristor has improved external light emission efficiency and require no driving circuit, thus achieving a low-cost optical print head for optical printers. When the self-scanning light-emitting element array using this end face light-emitting thyristor is applied to optical print heads, high-quality printing can be accomplished because each light-emitting element has improved external light emission efficiency.

What is claimed is:

1. An end face light-emitting thyristor for emitting light from an end face thereof, comprising:

a first semiconductor layer of a first conductivity type, a second semiconductor layer of a second conductivity type, a third semiconductor layer of the first conductivity type, and a fourth semiconductor layer of the second conductivity type stacked in that order on a substrate of the first conductivity type, wherein the end face includes an edge of at least two of the stacked semiconductor layers, a first electrode provided on the fourth semiconductor layer in the vicinity of the edge for injecting current into the stacked semiconductor layers, wherein the current injected from the first electrode is concentrated near the end face, whereby light is primarily emitted from the end face, and a second electrode provided on the third semiconductor layer, wherein the first, second and third semiconductor layers have a necked portion between a region including the first electrode and a region including the second electrode.

2. A self-scanning light-emitting element array, comprising:

a self-scanning transfer element array having such a structure that a plurality of transfer elements each having a control electrode for controlling threshold voltage or current for transfer operation are arranged, the control electrodes of the transfer elements are connected to the control electrode of at least one transfer element located in the vicinity thereof via an interactive resistor, power-supply lines are connected to the transfer elements by electrical means, and clock lines are connected to the transfer elements, and a light-emitting element array having such a structure that a plurality flight-emitting elements each having a control electrode for controlling threshold voltage or current are arranged, the control electrodes of the light-emitting element array are connected to the control electrodes of said transfer elements by electrical means, and lines for applying current for light emission of the light-emitting element are provided, wherein the light-emitting element is an end face light-emitting thyristor as set forth in claim 1.

3. A self-scanning light-emitting array, comprising:

a self-scanning transfer element array having such a structure that a plurality of transfer elements each having a control electrode for controlling threshold voltage or current for transfer operation are arranged, the control electrodes of the transfer elements are connected to the control electrode of at least one transfer element located in the vicinity thereof via an electrically unidirectional element, power-supply lines are connected to the transfer elements by electrical means, and clock lines are connected to the transfer elements, and a light-emitting element array having such a structure that a plurality of light-emitting elements each having a control electrode for controlling threshold voltage or current are arranged, the control electrodes of the light-emitting element array are connected to the control electrodes of said transfer elements by electrical means, and lines for applying current for light emission of the light-emitting element are provided, wherein the light-emitting element is an end face light-emitting thyristor as set forth in claim 1.

4. A self-scanning light-emitting array of claim 3, wherein the electrically unidirectional element is a diode.

\* \* \* \* \*